United States Patent
Lee

(10) Patent No.: US 7,572,719 B2
(45) Date of Patent: Aug. 11, 2009

(54) SEMICONDUCTOR DEVICE AND MANUFACTURING METHOD THEREOF

(75) Inventor: Kye Nam Lee, Youngin-shi (KR)

(73) Assignee: Dongbu Electronics Co., Ltd., Seoul (KR)

( * ) Notice: Subject to any disclaimer, the term of this patent is extended or adjusted under 35 U.S.C. 154(b) by 196 days.

(21) Appl. No.: 11/292,241

(22) Filed: Dec. 2, 2005

(65) Prior Publication Data
US 2006/0118887 A1 Jun. 8, 2006

(30) Foreign Application Priority Data
Dec. 3, 2004 (KR) .................. 10-2004-0101044

(51) Int. Cl.
*H01L 21/4763* (2006.01)
(52) U.S. Cl. .................. 438/585; 438/586; 438/592; 438/595; 438/596; 257/E21.428; 257/E21.433; 257/E21.444; 257/E21.625; 257/E21.626; 257/E29.135; 257/E29.255
(58) Field of Classification Search .......... 438/592, 438/142, 282, 585, 586, 596; 257/336, 344, 257/E21.435, E21.428, 433, 438, 444, 623, 257/625, 626, 634, E29.135, 255
See application file for complete search history.

(56) References Cited

U.S. PATENT DOCUMENTS

| | | | | |
|---|---|---|---|---|
| 4,818,715 A * | 4/1989 | Chao | .................. | 438/303 |
| 6,051,863 A * | 4/2000 | Hause et al. | .................. | 257/369 |
| 6,200,871 B1 * | 3/2001 | Moslehi | .................. | 438/303 |
| 6,506,642 B1 * | 1/2003 | Luning et al. | .................. | 438/231 |
| 6,790,719 B1 * | 9/2004 | Adetutu et al. | .................. | 438/195 |
| 6,841,826 B2 * | 1/2005 | Dokumaci et al. | .................. | 257/336 |
| 6,881,976 B1 * | 4/2005 | Zheng et al. | .................. | 257/69 |
| 6,949,482 B2 * | 9/2005 | Murthy et al. | .................. | 438/739 |
| 7,232,756 B2 * | 6/2007 | Ku et al. | .................. | 438/682 |
| 7,391,087 B2 * | 6/2008 | Murthy et al. | .................. | 257/396 |
| 7,422,971 B2 * | 9/2008 | Murthy et al. | .................. | 438/595 |
| 2004/0080014 A1 * | 4/2004 | Ryoo | .................. | 257/500 |
| 2004/0209432 A1 * | 10/2004 | Ku et al. | .................. | 438/301 |
| 2005/0048794 A1 * | 3/2005 | Brask et al. | .................. | 438/768 |
| 2005/0087824 A1 * | 4/2005 | Cabral et al. | .................. | 257/412 |

* cited by examiner

*Primary Examiner*—Michael S Lebentritt
(74) *Attorney, Agent, or Firm*—Finnegan, Henderson, Farabow, Garrett & Dunner, L.L.P.

(57) ABSTRACT

A method of manufacturing a semiconductor device is provided. The method includes: sequentially forming an oxide layer and a nitride layer on a substrate having a gate insulating layer and a gate formed in the order named thereon; forming a spacer at both sidewalls of the gate by etching the nitride layer; forming a source region and a drain region at both sides of the spacer in the substrate; removing the oxide layer formed on the gate and the substrate; partially removing surfaces of the gate, the source region and the drain region from which the oxide layer is removed; and depositing and thermally annealing a metal layer on the surfaces of the gate, source and drain whose surfaces are partially removed, to form a salicide layer.

12 Claims, 3 Drawing Sheets

(a)

(b)

(c)

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a formation of a salicide for a semiconductor device.

2. Description of the Related Art

As semiconductor devices advance in operation speed, some of their elements, for example, gate resistance of a MOS device, contact resistance of the source and drain region serve as factors to cause the operation speed of the semiconductor devices to be slow. To prevent the operation speed from being slow, a method of forming a salicide layer on gate, source and drain regions has been widely used.

A method of manufacturing a semiconductor device according to the related art will now be described with reference to FIGS. 1A to 1C.

Referring to FIG. 1A, the related art semiconductor device includes a substrate 10 having a device isolation layer 11. A gate insulating layer 12 is formed on the substrate 10 and a gate 13 is formed on the gate insulating layer 12.

Next, an oxide layer 16 and a nitride layer 17 are sequentially formed on an entire surface of the substrate 10 so as to cover the gate 13. Then, the nitride layer 17 is etched back to form a nitride spacer on both sidewalls of the gate 13. Thereafter, impurity ions having an opposite conductivity type to the substrate 10 are implanted at a high concentration into the substrate 10 to form a source region 18' and a drain region 18 at both sides of the gate 13 in the substrate 10.

At this time, oxygen 100 penetrates into the surfaces of source region 18', the drain region 18 and the gate 13 and remains thereon.

Next, referring to FIG. 1B, the oxide layer 16 on the gate 13 and the substrate 10 is removed to expose the surfaces of the gate 13, the source region 18' and the drain region 18.

Next, referring to FIG. 1C, a metal layer is deposited on the exposed surfaces of the source region 18', the drain region 18 and the gate 13, and is then thermally annealed to form a salicide layer 19.

However, in the related art semiconductor device, since the impurity ions for the formation of the source region 18' and the drain region 18 are implanted at a high concentration, if the oxide layer 16 remains on the surface of the substrate 10, an oxygen knock-on effect in which oxygen 100 of the oxide layer 16 penetrates into the surfaces of the source region 18', the drain region 18 and the gate together with the impurities may occur.

Thus, the oxygen 100 penetrating into the surfaces of the source region 18', the drain region 18 and the gate 13 is not completely removed but remains thereon even after the oxide layer 16 is removed. The remaining oxygen 100 prevents a salicide from being formed during the subsequent salicide process, so that an instable and non-uniform salicide layer 19 is formed to increase the resistances of the gate 13, the source region 18' and the drain region 18, as shown in FIG. 1C.

In addition, if the oxide 16 is over-etched so as to solve the oxygen knock-on effect, the oxygen 100 on the surfaces of the gate 13, the source region 18' and the drain region 18 is partially removed, but another problem, such as a reverse narrow width effect in which the threshold voltage is dropped at a boundary (A) between the device isolation layer 11 and the active region due to an excessive loss of the insulating layer, occurs.

SUMMARY OF THE INVENTION

Accordingly, the present invention is directed to a semiconductor device and manufacturing method thereof that substantially obviates one or more problems due to limitations and disadvantages of the related art.

An object of the present invention is to provide an a semiconductor device with improved electrical properties and reliability, and a manufacturing method thereof by completely removing oxygen existing on surfaces of gate, source and drain regions to form a uniform salicide.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of manufacturing a semiconductor device, the method including: sequentially forming an oxide layer and a nitride layer on a substrate having a gate insulating layer and a gate formed in the order named thereon; forming a spacer at both sidewalls of the gate by etching the nitride layer; forming a source and a drain at both sides of the spacer in the substrate; removing the oxide layer formed on the gate and the substrate; partially removing surfaces of the gate, the source region and the drain region from which the oxide layer is removed; and depositing and thermally annealing a metal layer on the surfaces of the gate, source and drain whose surfaces are partially removed, to form a salicide layer.

In another aspect of the present invention, there is provided a method of manufacturing a semiconductor device, the method including: forming an oxide layer on a substrate including a gate insulating layer and a gate formed in the order named thereon; forming a source region and a drain region at both sides of the gate in the substrate; removing the oxide layer formed on the gate and the substrate; partially removing surfaces of the gate, the source region and the drain region from which the oxide layer is removed; and depositing and thermally annealing a metal layer on the gate, source region and drain region whose surfaces are partially removed, to form a salicide layer.

In a further another aspect of the present invention, there is provided a semiconductor device including: a substrate having a device isolation layer; a gate insulating layer and a gate sequentially formed on the substrate; a spacer formed on sidewalls of the gate; a source region and a drain region formed at both sides of the spacer in the substrate; and a salicide layer formed by partially removing surfaces of the gate, the source region and the drain region and depositing and thermally annealing a metal layer on the surfaces of the gate, the source region and the drain region whose surfaces are partially removed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
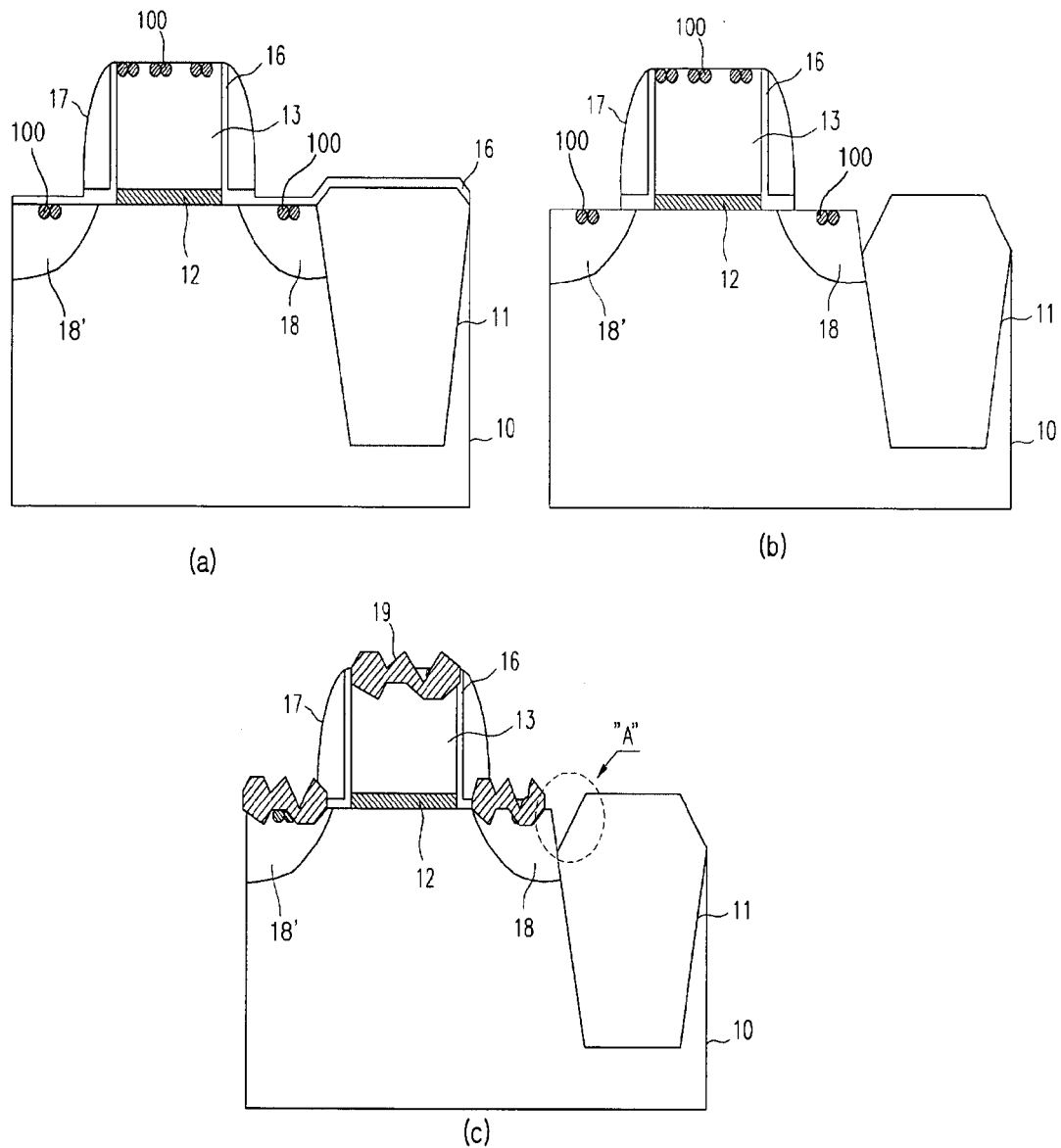
FIGS. 1A to 1C are partial sectional views illustrating a method of manufacturing a semiconductor device according to the related art.
Figure 2:
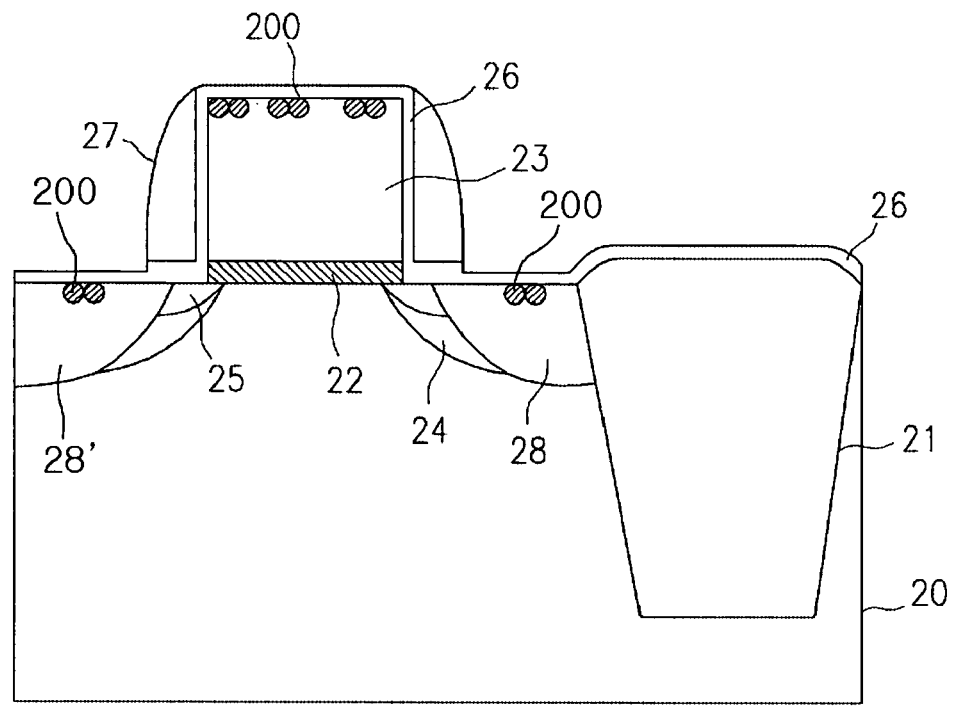
FIGS. 2 to 4 are partial sectional views illustrating a method of manufacturing a semiconductor device according to an embodiment of the present invention.
Figure 3:
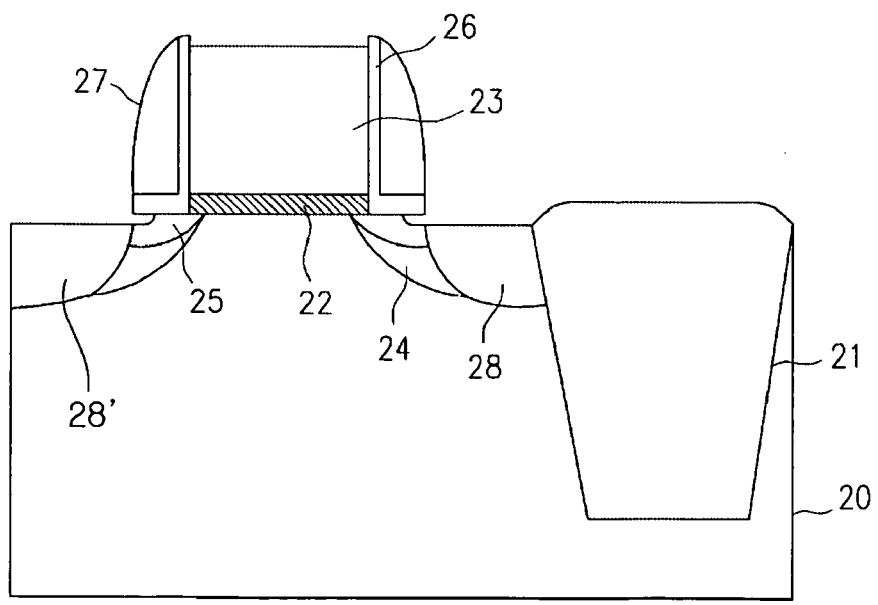
Figure 4:
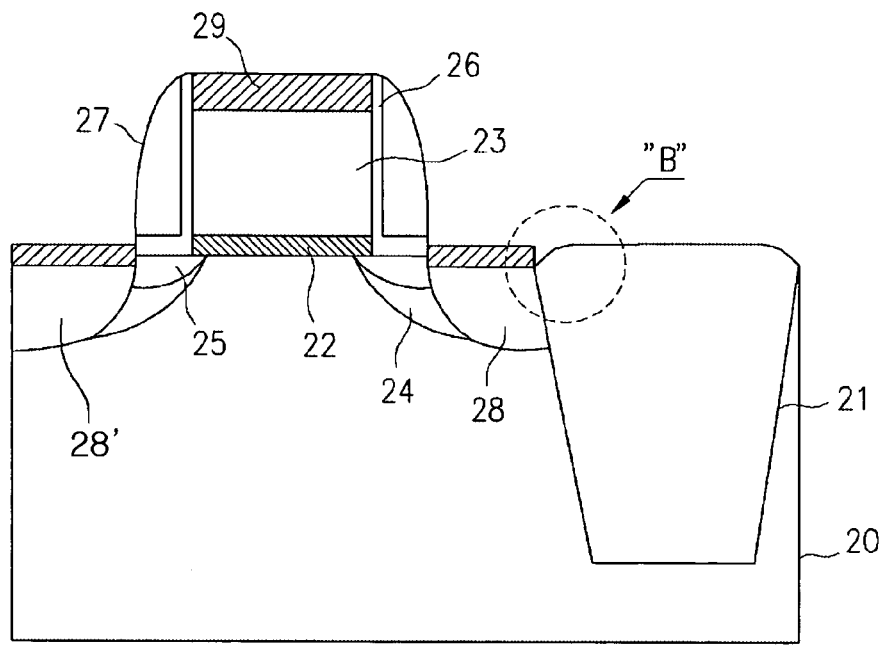

FIGS. 2 to 4 are partial sectional views illustrating a method of manufacturing a semiconductor device according to an embodiment of the present invention.

Referring to FIG. 2, a device isolation layer 21 is formed in a substrate 20 using a shallow trench isolation (STI) technology, and subsequently a gate insulating layer 22 is formed on the substrate 20 including the device isolation layer 21. Herein, the substrate 20 may be a silicon substrate.

Next, a polysilicon layer is deposited on the gate insulating layer 22 and a photoresist pattern (not shown) is formed on the polysilicon layer by using a photolithography process.

Thereafter, the polysilicon layer is etched using the photoresist pattern as an etch mask to form a gate 23, and then the photoresist pattern is stripped.

Next, a first oxide layer (not shown) is formed on an entire surface of the substrate 20 so as to cover the gate 23, and impurity ions having the same conductive type as that of the substrate 20 are implanted into the substrate 20 to form pocket regions 24 at both sides of the gate 23 within the substrate 20.

For instance, when the substrate 20 is a p-type, p-type impurity ions are implanted, and when the substrate 20 is an n-type, n-type impurity ions are implanted.

Next, impurity ions having an opposite conductivity type to the substrate 20 are implanted at a low concentration into the substrate 20 to form lightly doped drain (LDD) regions 25 at both sides of the gate 23 within the substrate 20.

For instance, when the substrate 20 is a p-type, n-type impurity ions are implanted, and when the substrate 20 is an n-type, p-type impurity ions are implanted.

Herein, the first oxide layer serves as a screen layer for preventing the substrate from being damaged during the ion implantation. The pocket regions 24 are formed deeper than the LDD regions 25 such that the surroundings of the LDD regions 25 are higher in ion concentration than the channel region, thereby suppressing the short channel effect.

Next, a second oxide layer 26 is formed on the substrate 20 so as to cover the gate 23, and a nitride layer is also deposited on the second oxide layer 26. Thereafter, the nitride layer is etched back such that the second oxide layer 26 on the substrate 20 is exposed, thereby forming a nitride spacer 27 on both sidewalls of the gate 23.

Herein, the second oxide layer 26 covering the gate 23 serves as a buffer to the nitride spacer 27, and the second oxide layer 26 left on the substrate 20 serves as a screen layer during a subsequent ion implantation.

Next, impurity ions with an opposite conductivity type to the substrate 20 are implanted at a high concentration into the substrate 20 of both sides of the spacer 27 to form a source region 28' and a drain region 28. At this time, the oxygen knock-on effect due to high concentration impurities allows oxygen to locate at surfaces of the source region 28', drain region 28 and the gate 23.

Alternatively, a silicide process may be carried out without depositing the nitride layer on the second oxide layer 26 to form the spacer.

Next, referring to FIG. 3, the second oxide layer 26 left on the surfaces of the substrate 20 and the gate 23 is removed using an oxide etchant, so that the upper surfaces of the gate 23, the source region 28' and the drain region 28 are exposed.

The oxide etchant can be performed by a wet etch using an HF solution. Also, a precise etch may be performed using a buffered oxide etchant (BOE) for a long time so as to adjust the etch rate of the oxide layer. The BOE is a mixture solution of HF and $NH_4F$, having a mixing ratio range of 1:5 to 11.5. In the BOE according to the present embodiment, the mixing ratio of HF to $NH_4F$ is 1:5.

Next, the surfaces of the source region 28', the drain region 28 and the gate 23 as exposed are partially removed by the wet etch using a silicon etchant until the oxygen 200 (see FIG. 2A) is completely removed. In the embodiment according to the present invention, the surfaces of the source region 28', the drain region 28 and the gate 23 are removed by a thickness of 50 Å or less. In another embodiment of the present invention, the surfaces of the source region 28', the drain region 28 and the gate 23 are removed by a thickness range of 20 Å to 50 Å.

By a wet etch using an aqueous solution containing $HNO_3$ and HF as the silicon etchant or an aqueous solution containing $H_2O_2$ and HF, it is possible to slightly etch the surfaces of the source region 28', the drain region 28 and the gate 23.

As aforementioned, since the second oxide layer 26 left on the surfaces of the substrate 20 and the gate 23 is removed and the surfaces of the source region 28', the drain region 28 and the gate 23 are partially removed such that the oxygen 200 located at the surfaces of the source region 28', the drain region 28 and the gate 23 is removed, the device isolation layer 21 is not excessively lost from a boundary between the device isolation layer 21 and the active region.

Referring to FIG. 4, a salicide layer is formed only on the source region 28', the drain region 28 and the gate 23 by a salicide process.

The salicide process includes depositing a metal layer, such as titanium (Ti), cobalt (Co) or the like on an entire surface of the substrate 20, thermally annealing the deposited metal layer to reach the metal layer with silicon, and removing a non-reacted metal layer left without any reaction between the metal layer and silicon. The salicide layer can be formed in a thickness range that does not damage the device.

A process of forming a Co-salicide in the manufacturing method of a semiconductor device according to an embodiment of the present invention will now be described.

Specifically, a process of forming a Co salicide after the exposed surfaces of the source region 28', the drain region 28 and the gate 23 are partially removed by a wet etch using a silicon etchant, will now be described.

In order to form a Co-salicide, surfaces of the gate 23, the source region 28' and the drain region 28 are cleaned using DHF (Dilute Hydrofluoric Acid) (HF:$H_2O$=1:100), and then metal layers of Co/Ti/TiN are sequentially deposited at thickness ranges of 130-160 Å, 180-220 Å, and 200-240 Å, respectively.

Next, the substrate 20 including the deposited metal layers of Co/Ti/TiN is thermally annealed by a rapid thermal process (RTA), at a temperature range of 480° C. to 500° C. for 40 seconds to 80 seconds.

Next, after the RTP, in order to remove the metal layers remaining on the surfaces of the gate 23, the source region 28' and the drain region 28 via a self-aligned silicidation, a wet etch for the resultant substrate is carried out using a aqueous solution in which $H_2SO_4$ and $H_2O_2$ are mixed at a mixing ratio of 1:1.5-3.

Next, in order to decrease the resistivity of the Co-salicide and to minimize the junction leakage, an RTA is carried out at a temperature range of 800° C. to 820° C., for 20-40 seconds to form a Co-salicide 80.

The Co-salicide ($CoSi_x$) according to an embodiment of the present invention is mainly used for a device having a design rule of 0.13 μm Gate. Since the junction depth of such a device is about 1200 Å, i.e., about 0.12 μm, if the CoSix is deposited at a thickness of 400 Å or more, the junction may be broken out. Accordingly, it is preferable that the CoSix be deposited at a thickness less than 400 Å.

Next, a process of forming a Ti-salicide in the manufacturing method of a semiconductor device according to another embodiment of the present invention will now be described.

Specifically, a process of forming a Ti-salicide after the exposed surfaces of the source region 28', the drain region 28 and the gate 23 are partially removed by a wet etch using a silicon etchant, will now be described.

In order to form a Ti-salicide, surfaces of the gate 23, the source region 28' and the drain region 28 can be cleaned using a DHF (Dilute Hydrofluoric Acid) having a mixing ratio of HF:$H_2O$=1:90 to 110. In the current embodiment, the resultant substrate is cleaned using a DHF in which HF and $H_2O$ are mixed at a mixing ratio of 1:100.

Next, metal layers (not shown) of Ti and TiN are deposited on the cleaned substrate having the gate 23, the source region 28' and the drain region 28 at thickness ranges of 300-400 Å and 100-200 Å, respectively. In the present embodiment, Ti and TiN layers are deposited at thicknesses of 340 Å and 150 Å, respectively. Herein, the Ti-salicide can be prevented from being oxidized since it is capped by the TiN layer.

Next, in order to form a Ti-salicide ($TiSi_x$) on the gate 23 having the metal layer formed thereon, a first thermal annealing is carried out in an RTP in a nitrogen atmosphere. The first thermal annealing can be carried out at a temperature range of 600-800° C. for 10-50 seconds. In the present embodiment, the first thermal annealing is carried out at a temperature range of 700-750° C. for 30 seconds.

Since the RTP is performed in the nitrogen atmosphere, a short-circuit between the drain region and the gate and between the source region and the gate due to a diffusion of Ti atoms toward the silicon substrate can be prevented. Also, since the nitrogen is absorbed into a grain boundary of Ti crystal to serve as a diffusion barrier layer which hinders migration of silicon atoms, Ti-salicide is not formed on the spacer, so that short-circuit can be prevented.

Next, the Ti metal layer other than the Ti-salicide remaining on the oxide layer except for regions where the Ti metal layer is transformed into the Ti-salicide is removed. The remaining metal layer other than the Ti-salicide can be removed by a wet etch using a mixing solution of $H_2SO_4$ and $H_2O_2$ at a mixing ratio of 1:1 to 3. In the present embodiment, the remaining metal layer is removed by a wet etch using a mixing solution of $H_2SO_4$ and $H_2O_2$ at a mixing ratio of 1:2. Alternatively, a solution having a mixing ratio of $NH_4OH$: $H_2O(DIW)$:30%$H_2O_2$:=1:1–2:4–6 may be used as the solution for the wet etch.

Next, in order to decrease the resistivity of the Ti-salicide after the metal layer remaining on the boundary of the oxide layer is removed, a second thermal annealing can be carried out at a temperature range of 700° C. to 900° C., for 10-30 seconds where a phase transition becomes possible. In the present embodiment, the second thermal annealing is carried out at a temperature range of 800-850° C. for 20 seconds.

At this time, the second thermal annealing can be carried out in an Ar atmosphere. Meanwhile, if the temperature of the second thermal annealing exceeds 900° C., atoms of the drain region or source region can be rapidly outdiffused into the overlying salicide layer to increase the contact resistance. Accordingly, it is preferable that the temperature of the second thermal annealing should not exceed 900° C.

The Ti-salicide ($TiSi_x$) according to an embodiment of the present invention is mainly used for a device having a design rule of 0.25 μm Gate. Since the junction depth of such a device is about 0.15 μm, it is preferable that the TiSix be deposited at a thickness less than 600 Å.

Figure 5:
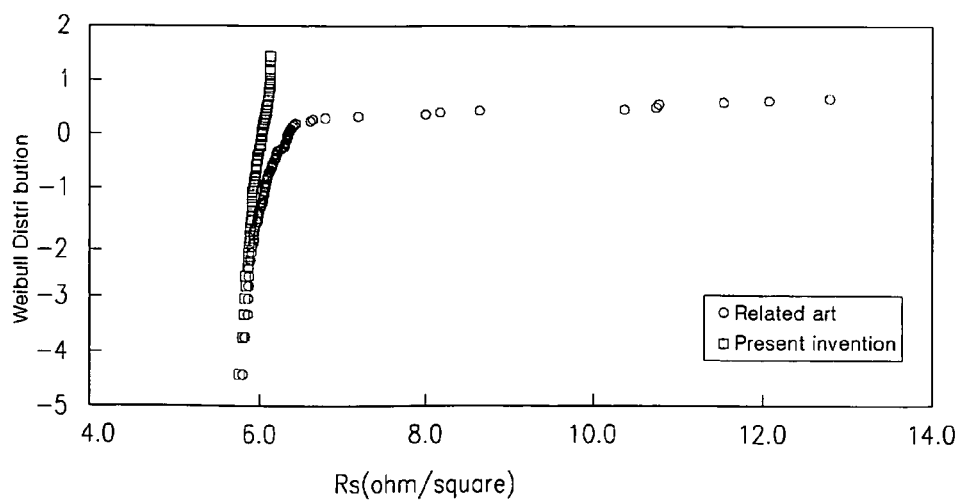
FIG. 5 is a graph showing measurement results of gate resistances of a related art semiconductor device and an inventive semiconductor device.

FIG. 5 is a graph showing measurement results of gate resistances of a related art semiconductor device and an inventive semiconductor device. From FIG. 5 showing the Weibull distribution in the gate resistance, it can be seen that unlike in the related art case that the salicide layer is instably and non-uniformly formed on the gate, in the present invention case, the salicide layer is stably and uniformly formed.

From the graph of FIG. 5, it can be seen that the semiconductor device and manufacturing method thereof according to the present invention remarkably improves the resistance characteristic compared to that according to the related art. As a result, the semiconductor device according to the present invention is enhanced in the electrical characteristics and the reliability.

As described above, according to the present invention, a screen oxide layer remaining on the surfaces of the substrate and the gate is first removed and then oxygen remaining on the surfaces of the source region, the drain region and the gate is completely removed by partially removing their surfaces by a predetermined thickness.

Accordingly, as shown in FIG. 4, an excessive loss of the device isolation layer from a boundary between the device isolation layer and the active region is prevented (B), so that the reverse narrow width effect is minimized.

Also according to the present invention, since oxygen does not exist on the surfaces of the source region, the drain region and the gate during the salicide process, the salicide layer is stably and uniformly formed, so that the resistance characteristics in the source region, the drain region and the gate are improved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of manufacturing a semiconductor device, the method comprising:
   sequentially forming an oxide layer and a nitride layer on a substrate having a gate insulating layer and a gate formed in the order named thereon;

forming a spacer at both sidewalls of the gate by etching the nitride layer;

forming a source region and a drain region at both sides of the spacer in the substrate;

removing the oxide layer formed on the gate and the substrate;

removing oxygen at a surface portion of the gate and surface portions of the source region and the drain region by partially removing the surface portion of the gate, and the surface portions of the source region and the drain region; and depositing and thermally annealing a metal layer on surfaces of the gate, the source region, and the drain region, whose surface portions are partially removed, to form a salicide layer;

wherein removing the oxide layer further comprises performing a wet etch process using an oxide etchant and a buffered oxide etchant (BOE) to adjust the etch rate of the oxide layer, and wherein partially removing the surface portion of the gate and the surface portions of the source region and the drain region comprises performing a wet etch process using a silicon etchant containing both $H_2O_2$ and HF.

2. The method of claim 1, wherein the sequentially forming of the oxide layer and the nitride layer further comprises forming LDD (Lightly Doped Drain) regions at both sides of the gate in the substrate after forming the gate.

3. The method of claim 2, after forming the gate and prior to forming the LDD regions, further comprising forming pocket regions located deeper than the LDD regions at both sides of the gate in the substrate.

4. The method of claim 1, wherein the BOE is a mixture solution of HF and $NH_4F$, having a mixing ratio range of 1:5 to 11:5.

5. The method of claim 1, wherein the surface of the gate and the surfaces of the source region and drain region are partially removed by a thickness of 50 Å or less.

6. The method of claim 1, wherein the depositing of the metal layer is performed by sequentially depositing a Ti layer and a TiN layer.

7. The method of claim 1, wherein the depositing of the metal layer is performed by sequentially depositing a Co layer, a Ti layer and a TiN layer.

8. The method of claim 1, wherein the forming of a salicide layer comprises:

first thermally annealing the substrate;

cleaning the substrate to remove a residue of the metal layer; and secondly thermal annealing the substrate.

9. A method of manufacturing a semiconductor device, the method comprising:

forming an oxide layer on a substrate including a gate insulating layer and a gate formed in the order named thereon;

forming a source region and a drain region at both sides of the gate in the substrate;

removing the oxide layer formed on the gate and the substrate;

removing oxygen at a surface portion of the gate and surface portions of the source region and the drain region by partially removing the surface portion of the gate, and the surface portions of the source region and the drain region; and depositing and thermally annealing a metal layer on the gate, the source region, and the drain region, whose surface portions are partially removed, to form a salicide layer;

wherein removing the oxide layer further comprises performing a wet etch process using an oxide etchant and a buffered oxide etchant (BOE) to adjust the etch rate of the oxide layer, and wherein partially removing the surface portion of the gate and the surface portions of the source region and the drain region comprises performing a wet etch process using a silicon etchant containing both $H_2O_2$ and HF.

10. The method of claim 9, wherein the surface of the gate and the surfaces of the source region and drain region are partially removed by a thickness of 50 Å or less.

11. The method of claim 9, wherein the BOE is a mixture solution of HF and $NH_4F$, having a mixing ratio range of 1:5 to 11.5.

12. The method of claim 9, wherein partially removing of the surface portion of the gate and the surface portions of the source region and the drain region comprises performing a wet etch using a silicon etchant, wherein the silicon etchant is an aqueous solution containing $HNO_3$ and HF or an aqueous solution containing $H_2O_2$ and HF.

* * * * *